United States Patent
Sauter

(10) Patent No.: US 6,743,048 B1
(45) Date of Patent: Jun. 1, 2004

(54) MEASURING SYSTEM WITH CYLINDRICAL HOUSING BODY CARRYING ELASTIC TONGUES FOR CONNECTION TO A SUPPORT MEMBER

(75) Inventor: Roland Sauter, deceased, late of Villingen-Schwenningen (DE), by Margit Sauter née Schwaderer, legal representative

(73) Assignee: TRW Automotive Electronics & Components GmbH & Co. KG (DE)

( * ) Notice: Subject to any disclaimer, the term of this patent is extended or adjusted under 35 U.S.C. 154(b) by 0 days.

(21) Appl. No.: 09/423,926

(22) PCT Filed: Mar. 26, 1998

(86) PCT No.: PCT/DE98/00895

§ 371 (c)(1),
(2), (4) Date: May 4, 2001

(87) PCT Pub. No.: WO98/51998

PCT Pub. Date: Nov. 19, 1998

(30) Foreign Application Priority Data

May 14, 1997 (DE) ......................................... 197 20 196

(51) Int. Cl.$^7$ ............................................... H01R 13/73
(52) U.S. Cl. ...................... 439/557; 439/572; 439/567; 439/571; 439/329
(58) Field of Search ............................... 439/508, 517, 439/549, 572, 567, 551, 554

(56) References Cited

U.S. PATENT DOCUMENTS

| | | | | |
|---|---|---|---|---|
| 4,139,727 A | * | 2/1979 | Kuballa | 439/567 |
| 4,548,450 A | * | 10/1985 | Reimer et al. | 439/572 |
| 4,551,587 A | * | 11/1985 | Rose | 200/11 R |
| 4,588,854 A | * | 5/1986 | Bailey et al. | 439/572 |
| 5,117,330 A | * | 5/1992 | Miazga | 439/572 |
| 5,396,928 A | * | 3/1995 | Cummings | 200/61.86 |
| 5,452,512 A | * | 9/1995 | Foley et al. | 439/78 |

\* cited by examiner

*Primary Examiner*—Gary Paumen
*Assistant Examiner*—Briggitte R. Hammond
(74) *Attorney, Agent, or Firm*—Fay, Sharpe, Fagan, Minnich & McKee, LLP

(57) ABSTRACT

A measuring system is provided including a substantially cylindrical housing and a plurality of spaced apart elastic locking tongues carried on an outer circumference of the housing. The locking tongues selectively engage and lock into a corresponding plurality of cavities defined in an associated support plate when the measuring system is brought into aligned contact with the support plate. A plurality of spaced apart contact pins are provided on the measuring system and extend from a bottom surface of the housing. The contact pins engage into a corresponding set of contact cavities provided on the associated support plate. In addition, a set of centering members are provided on the measuring system extending from the housing for selective insertion into a corresponding set of centering cavities arranged on the support plate. The centering members extend from the housing a distance greater than the elastic locking tongues so that the centering members engage the support plate before the locking tongues contact the plate to properly align the tongues relative to the plate thereby preventing damage during connection between the measuring system and the support plate. In addition, the locking tongues extend from the housing member a distance greater than the plurality of contact pins to ensure that the locking tongues engage the support plate before the contact pins during assembly of the measuring system onto the support plate.

13 Claims, 1 Drawing Sheet

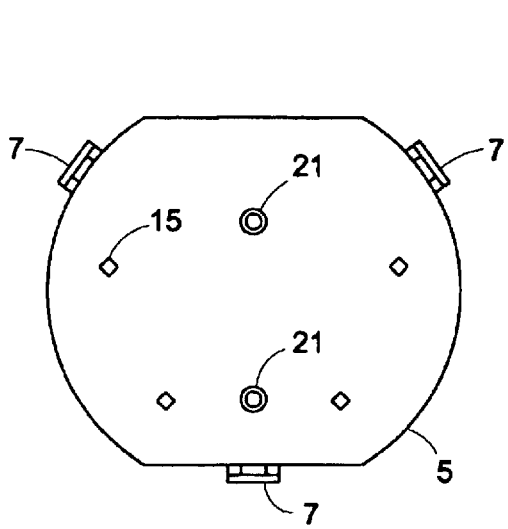
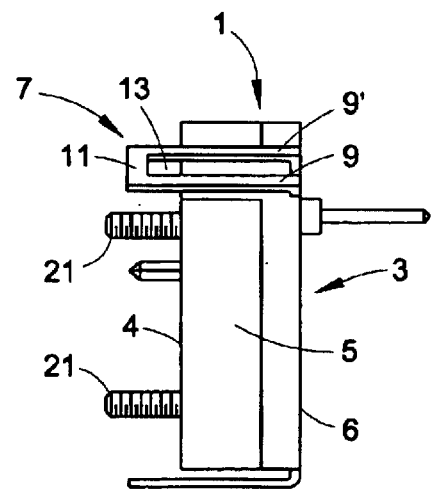
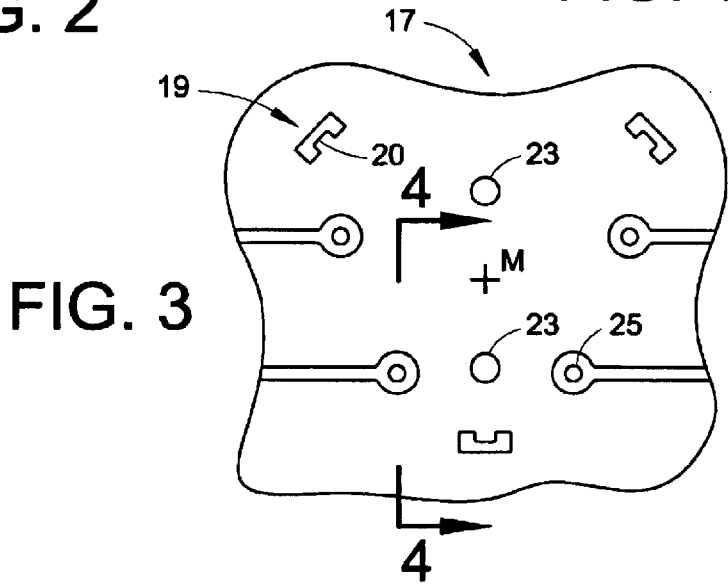
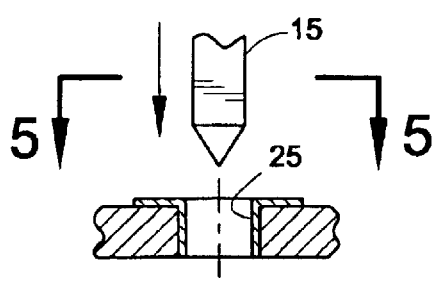
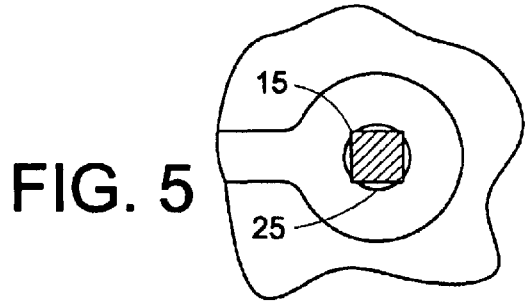
FIG. 2
FIG. 1
FIG. 3
FIG. 4
FIG. 5

MEASURING SYSTEM WITH CYLINDRICAL HOUSING BODY CARRYING ELASTIC TONGUES FOR CONNECTION TO A SUPPORT MEMBER

BACKGROUND OF THE INVENTION

The subject invention is directed to the art of measuring systems and, more particularly, to method and apparatus for electrically and mechanically connecting measuring systems such as general gauge-type devices to operatively associated support members.

In this application, "measuring system" refers to an electrostatic or electrodynamic meter movement, i.e. a moving coil instrument or moving iron instrument with a corresponding element inside, namely, a measuring coil. Meter movements of this kind are used in automotive engineering, for example, in order to display parameters such as acceleration, speed, fuel gauge readings, and the like on an automotive control panel. As is known, a meter movement displays the flow of current as the electric variable by means of an inductive reaction between coils in the measuring device resulting in a rotary movement of an output member acting against a spring force. For the desired functions such as speedometer or fuel gauge application, the known actual values are transformed into current values with the aid of electronic circuits so that they can be displayed with the aid of a meter movement.

Measuring systems of the type under consideration are often joined to support members or plates in a number of different ways. Typically, mounting is accomplished by means of screws or the like. One drawback to this method, however, is that substantial time and effort is required for tightening the screws to adequately connect the measuring system to the support plate. In addition, in order to establish suitable electrical connections to the measuring system, soldering steps or the like are also often required in order to ensure the necessary electrical integrity between the measuring system and the support member. Generally, fastening and soldering are time consuming and awkward.

Accordingly, in DE-A-195 19 834, a connection between a measuring system and a support member is proposed wherein the measuring system can be connected quickly with the support by means of a bayonet catch mechanism. As described in the '834 patent, electric contact between the measuring system and the support member is effected using elastic tongues arranged at the outer surface of the measuring system. The tongues are pressed by a spring force against designated contact areas on the support member when the measuring system is fastened to the support member.

With the above type arrangement between the measuring system and the support member, unwelcome twisting may occur after the connection is established as a result of external mechanical influences such as, for example vibration. When this happens, the contact tongues and the electric areas often become disengaged. In addition, complete detachment of the bayonet catch from the support member may also occur. Moreover, with the type of connection described, mechanical influences may also adversely affect the integrity of the one or more electrical connections between the measuring system and the support member. Since the electrical contacts are held in place by spring force alone, deterioration of the electrical contact connection may also occur.

SUMMARY OF THE INVENTION

The subject invention provides a measuring system and a method and apparatus for electrically and mechanically connecting the measuring system to an operatively associated support member that overcomes the noted problems and results in a cost effective measuring system which enables simple, cost effective, and robust connection with a support plate as well as an arrangement of such measuring system on the support plate which prevents accidental twisting and/or separation of the measuring system from the support plate after installation.

In particular, and in accordance with one aspect of the invention, there is provided a measuring system including a substantially cylindrical housing defining a bottom surface and a lid surface. A plurality of spaced apart elastic locking tongues are carried on an outer circumference of the cylindrical housing. The locking tongues are adapted to be received and lock into a corresponding plurality of suitably arranged cavities defined in an associated support plate when the measuring system is selectively brought into aligned engagement with the associated support plate.

In accordance with a more limited aspect of the invention, the measuring system includes a plurality of spaced apart electric contact pins extending from the bottom surface of the cylindrical housing. The contact pins are adapted for insertion into a corresponding plurality of suitably arranged contact cavities defined in the associated support plate.

Preferably, the plurality of spaced apart contact pins have a quadratic cross-section. In addition, the plurality of spaced apart contact pins include contact areas defining flexible press-in zones with first profiles for engagement with complimentary shaped second profiles formed by the plurality of contact cavities. The contact pins are preferably adapted for gas-tight contact with the corresponding plurality of contact cavities. Further, the contact pins are preferably tin plated.

In accordance with a still further limited aspect of the invention, the measuring system includes at least one centering member extending from the bottom surface of the cylindrical housing. The centering member is adapted for insertion into a corresponding at least one suitably arranged centering cavity defined in the associated support plate.

Preferably, the centering members extend from the bottom surface of the cylindrical housing by a first predetermined distance which is greater than a second predetermined distance that the plurality of elastic locking tongues extend from the bottom surface of the housing. In that way, the centering members engage the face surface and/or centering cavities of the associated support member before the elastic locking tongues when the measuring system and support member are brought together toward their final assembled condition. The engagement between the centering members on the housing with the centering cavities provided on the support member ensure proper alignment between the measuring system and the support member and prevent relative rotation therebetween.

Lastly, preferably, the elastic locking tongues extend from the bottom surface of the housing by a distance greater than the distance that the contact pins extend from the cylindrical housing. In that way, the contact pins engage the corresponding plurality of contact cavities in the support plate after both the centering members and the plurality of locking tongues establish mechanical contact with the associated support plate.

As can be seen from the foregoing, the primary object of the invention is the provision of a measuring system that includes elastic tongues arranged in a spaced apart relationship on the outer circumference of a cylindrical housing body, the elastic tongues being adapted to engage corresponding cavities formed in an associated support plate so that a secure mechanical connection is established thereby preventing subsequent unwelcomed inadvertent or accidental twisting and/or separation between the measuring system and the support plate. In the preferred arrangement, the plurality of locking tongues are formed integrally on the housing such as, for example, by injection molding. This arrangement provides for a cost effective manufacture of the subject measuring system and its housing while enabling a subsequent rapid and simple installation of the measuring system onto the support member.

Preferably, the support plate includes electrical conductors and, therefore, is formed as a conductor plate. For establishing electrical contact with the conductors in the support plate, a plurality of contact pins are provided and protrude from the underside of the measuring system. The contact pins are selectively inserted into a corresponding plurality of contact cavities formed in the support plate. With the connection described above, simultaneous electrical and mechanical connection between the measuring system and the support plate is simultaneously established.

The electrical connection between the contact pins and the plurality of contact cavities during connection of the measuring system with the support plate is effective, for example, by mechanical interference pressing and/or subsequent soldering.

In the preferred embodiment of the invention, the plurality of contact pins have a quadratic cross-section. The corresponding plurality of contact cavities are preferably formed with a substantially round cross section. This permits the use of cost effective commercial contact pins and conductor plates. In the preferred embodiment described, a line contact is established between the outer surfaces of the plurality of contact pins and the inner wall surfaces of the circular contact cavities. The line contact zones are formed alongside the edges of the contact pins. In such arrangement the connection pins of the measuring coil itself beneficially serve as contact pins. Other profiles of the contact pins and/or contact cavities are also contemplated including forming square contact cavities and cylindrical contact pins as well as other complementary forms and arrangements.

Preferably, the contact pins have free ends with a tapered shape and/or the apertures of the contact cavities are formed in a funnel shape in order to help facilitate the operative connection between the measuring system and the support member. The tapered shape of the contact pins and/or the funnel shape of the contact cavities provide a self-centering effect during relative motion between the contact pins and the contact cavities as the measuring system and support member are brought together toward their final assembled condition.

In a further embodiment of the invention, the contact cavities are formed as perforations extending through the support member. In that embodiment, the contact cavities formed as perforations accommodate the contact pins passed therethrough and establish an electrical contact therewith along the sides of the contact pins. This permits, in a beneficial fashion, a gas-tight connection between the contact locations or the contact areas of the contact pins and the contact cavities. The above constructions further contribute to an improvement in the electrical connection between the contact pins and the respective contact cavities.

In another embodiment, the electrical connection enables plating of the contact cavities with a tin alloy and/or a tin plating of the contact pins. Further, it is also contemplated that the contact cavities and/or contact pins are coated with another alloy or substance having good electrical conductivity properties such as, for example, gold plating.

In order to prevent unwelcome mechanical stresses at the contact pins during installation, at least one centering bolt is provided on the measuring system. The at least one centering bolt is introduced into a corresponding suitably arranged at least one centering cavity formed in the support plate when the measuring system and support plate are brought together. In order to facilitate insertion into the centering cavity, the centering bolts are preferably formed with a tapered free end. Likewise, the corresponding centering one or more cavities provided on the support member are selectively provided with a funnel-shaped aperture for the above purpose.

Lastly, the present invention also contemplates constructions that are the respective kinematic reverse of those described herein.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts, the preferred embodiments of which will be described in detail in this specification and illustrated in the accompanying drawings which form a part hereof, and wherein:

FIG. 1 is a side lateral plan view of the subject measuring system formed in accordance with the invention;

FIG. 2 is a bottom plan view of the measuring system according to FIG. 1;

FIG. 3 is a top plan view of a support plate formed in accordance with the invention in combination with the measuring system shown in FIGS. 1 and 2;

FIG. 4 is an enlarged cross-sectional view of the support plate taken along line 4—4 in FIG. 3 and showing an associated contact pin adjacent to the plate; and, FIG. 5 is a top plan view in partial cross-section taken along line 5—5 in FIG. 4.

DETAILED DESCRIPTION OF THE PREFERRED EMBODIMENTS

Referring now to the drawings wherein the showings are for the purposes of illustrating the preferred embodiments of the invention only and not for purposes of limiting same, the overall arrangement of the preferred form of a measuring system formed in accordance with the invention can best be seen by reference to FIGS. 1 and 2. As shown therein, the measuring system 1 comprises a generally cylindrical housing member 3 having essentially a circular outer surface with two opposing flattened sides and a substantially uniform height. The housing 3 thus has the characteristic shape of a cylinder having a bottom surface 4, and outer circumference 5, and a lid surface 6.

A set of rectangular resilient locking springs 7 are arranged on the outer circumference 5 of the cylindrical housing member 3. Preferably, three (3) the rectangular locking springs 7 are provided. The locking springs are preferably arranged to be equidistant along the outer circumference 5. As can be seen, the rectangular locking springs 7 extend from the housing 3 substantially in parallel with the major axis defined by the height of the cylindrical housing 3.

Preferably, as shown, the locking springs comprise two parallel, spaced apart, longitudinal sides 9, 9', which are formed integrally on one end with the housing 3. At each free end of the locking springs, the pair of longitudinal sides 9, 9', are joined together using a cross-piece 11 arranged at a right angle to the longitudinal sides to thus form a rectangular cavity 13 between the longitudinal sides 9, 9', and the cross-piece 11.

As is apparent from FIG. 1, the free end of each locking spring 7 protrudes beyond the height of the housing 3 so that a portion of the rectangular cavity 13 extends or protrudes beyond the housing bottom 4. The portions of the rectangular cavities 13 that extend beyond the housing bottom 4 find their counter-shape in a support plate 17 shown best in FIG. 3. To that end, a set of suitably arranged U-shaped cavities 19 are provided in the support plate 17 for selective acceptance of the portions of the locking springs 7 extending beyond the housing bottom 4. Preferably, the U-shaped cavities 19 are oriented so that the locking springs 7 can snap radially inwardly as the measuring system 1 is installed into the support plate 17. Further, the U-shaped cavities 19 are disposed in the support plate at positions corresponding to locations of the locking springs 7 carried on the housing member 3. The aperture of the "U" of each cavity 19 is directed toward the support plate center M as can be seen best in FIG. 3.

Further, as shown, a stop nose 20 is formed at each U-shaped cavity 19. The stop nose faces away from the support plate's center M. Preferably, the cavity 19 is narrowed by the stop nose 20 only to the extent to enable the locking spring and the cross-piece carried thereon be comfortably inserted into the cavities 19.

With reference once again to FIGS. 1 and 2, a plurality of contact pins 15 (four as shown) are provided on the measuring system 1 and protrude from the underside or bottom 4 of the housing 3. Preferably, the contact pins are arranged on the underside in a rectangular layout and have a rectangular cross section. As can best be seen in FIG. 2, the contact pins 15 are further preferably arranged in a mirror image or in a symmetrical pattern relative to the longitudinal axis shown in dot and dash in FIG. 2 at varying distances relative to the axis.

In addition to the above, a set of centering members or bolts 21 are arranged at a distance from each other on the longitudinal axis that bisects the housing bottom as best shown in FIG. 2. Preferably, the centering members or bolts 21 are formed to have a substantially round cross section and to have a length so as to extend beyond the contact pins 15 relative to the bottom surface 4 of the housing 3. In addition, the centering bolts preferably have a length to extend beyond the locking springs 7 relative to the bottom surface 4 of the housing member 3.

As best depicted in FIG. 3, the support plate 17 of the invention is provided with a plurality of complementary centering cavities 23 corresponding in relative location to the arrangement of the centering bolts 21 carried on the measuring system 1. In that way, the centering cavities 23 on the support plate 17 receive the centering bolt 21 on the housing 3 when the measuring system 1 is connected to the support plate 17. In a similar fashion, the support plate 17 includes a plurality of suitably arranged contact cavities 25 designed as pass-through contacting holes or bores with adjacent electrical conductors for acceptance of the electrical contact pins 15 carried on the cylindrical housing 3. The cavities 25 are arranged in relative position to correspond to the contact pins 15 carried on the housing so that the pins are received into the cavities when the measuring system is selectively installed onto the support plate.

As best shown in FIG. 4, the contact pins 15 are preferably provided with tapered free ends formed in the shaped of sharp tips in order to enable easy insertion of the contact pins 15 into the contact cavities 25.

It is to be noted that during connecting the measuring system 1 onto the support plate 17, the centering bolts 21 first engage in the corresponding centering cavities 23. As described above, the centering members 21 extend from the bottom surface 4 of the cylindrical housing 3 to a greater extent than the elastic locking tongues 7. The centering members are longer than the locking tongues. Likewise, the elastic locking tongues 7 extend from the bottom surface 4 of the cylindrical housing 3 to a greater extent than the plurality of electrical contact pins 15 extend from the bottom surface. The elastic tongues are longer than the contact pins. In that way, if the centering members 21 miss the targeted centering cavities 23 during installation of the measuring system 1 onto the support plate 17, the free ends of the centering members abut the face surface of the support member and prevent further relative motion. Thus, no detrimental effects occur to either the elastic locking tongues 7 or the plurality of electrical contact pins 15. Deformation and/or damage to the contact pins 15 and/or to the locking springs 7 caused by relative misalignment between the measuring system 1 and the support plate 17 is thereby prevented.

Accordingly, with the proper insertion of the centering members 21 into the corresponding centering holes 23, there takes place a position-correct insertion of the contact pins 15 into the corresponding contact cavities 25. Essentially, the interference between the centering member 21 and the centering cavities 23 ensure proper alignment between the contact pins 15 and the corresponding set of contact cavities 25. At the same time, the free ends of the plurality of locking springs 7 are guided into a correct position relative to the corresponding cavities 19 formed on the support plate 17.

It is to be appreciated that as the underside of the housing 3 of the measuring system 1 contacts the surface of the support plate 17, the stop noses 20 catch behind the respective cross-piece 11 of the lock springs 7. This produces a solid connection between the measuring system 1 and the support plate 17. The connection cannot be loosened or detached by mechanical influences such as vibrations, or the like.

It is an advantage of the present invention that together with mechanical connection between the measuring system 1 and the support plate 17, there is produced, concurrently and in a beneficial manner, an electrical connection between the contact pins 15 and the contact cavities 25.

As best shown in FIG. 5, the inner diameter of the through-contacting contact cavity 25 is formed slightly smaller than the maximum outer diameter of the contact pin 15. The maximum outer diameter corresponds to the diagonal taken through the contact pin 15 which is substantially square in cross section. With the installed contact pin 15 there is thereby produced a gas-tight press fit.

Such press fits can also be provided using contact pins having other profiles with flexible insert zones or the like adapted for insertion into a corresponding plurality of contact cavities having a complementary contact cavity profile. Profiles and cavities which are contemplated essentially include U-shaped, V-shaped, T-shaped, etc. profiles for the contact pins 15 and complementary profiles for the contact cavities 25.

Although in the above description, a set of three (3) locking springs 7, four (4) contact pins 15, and two (2) centering bolts 21 were described, the present invention contemplates any number of locking springs, contact pins, and centering bolts. More or less locking springs, contact pins, and/or centering bolts can be used. In each instance, however, a correspondence between the locking springs and acceptance cavities are provided as well as a correspondence between the contact pins and contact cavities, and centering bolts and centering holes. More particularly, the acceptance cavities, contact cavities, and centering holes are provided in like number and like arrangement on the support plate to correspond with the number, location and arrangement of the locking springs, contact pins, and centering bolts, respectively.

The invention has been described with reference to the preferred embodiments. Obviously, modifications and alterations will occur to others upon a reading and understanding of this specification. It is intended to include all such modifications and alterations insofar as they come within the scope of the appended claims or the equivalents thereof.

What is claimed is:

1. A measuring device comprising:
    a substantially cylindrical housing defining a bottom surface and a lid surface;
    a plurality of spaced apart elastic locking tongues carried on an outer circumference of the cylindrical housing, the plurality of spaced apart locking tongues being adapted to engage and lock into a corresponding plurality of first cavities defined in an associated support plate when the measuring device is selectively brought into aligned contact with the associated support plate; and,
    a plurality of spaced apart contact pins extending from the bottom surface of the cylindrical housing, the plurality of contact pins being adapted for insertion into a corresponding plurality of contact cavities defined in said associated support plate when the measuring device is selectively brought into aligned contact with the associated support plate; and, at least one centering member extending from the bottom surface of the housing, the at least one centering member being adapted for insertion into a corresponding at least one centering cavity defined in said associated support plate, the at least one centering member extending from the bottom surface of the housing a greater distance than the plurality of contact pins extend from the bottom surface of the housing and extending from the bottom surface of the housing a greater distance than the plurality of elastic locking tongues extend from the bottom surface of the housing, the plurality of elastic locking tongues extending from the bottom surface of the housing a greater distance than the plurality of contact pins extend from the bottom surface of the housing.

2. The measuring device according to claim 1 wherein said plurality of spaced apart contact pins have a quadratic cross-section.

3. The measuring device according to claim 1 wherein said plurality of spaced apart contact pins include contact areas defining flexible press-in zones with first profiles for engagement with complimentary shaped second profiles formed by said plurality of contact cavities.

4. The measuring device according to claim 1 wherein said plurality of contact pins are adapted for gas-tight contact with said corresponding plurality of contact cavities.

5. The measuring device according to claim 1 wherein said plurality of contact pins include tin plating.

6. The measuring device according to claim 2 in combination with a support plate having a plurality of contact cavities being shaped as round holes formed in the support plate.

7. The measuring device according to claim 6 wherein the plurality of contact cavities are perforations extending through the support plate, the plurality of contact cavities contacting said plurality of spaced apart contact pins that pass through said perforations.

8. The measuring device according to claim 6 wherein said plurality of contact cavities include a tin-alloy plating coat.

9. The measuring device according to claim 6 wherein said support plate includes electrical conductors.

10. The measuring device according to claim 1 in combination with a support plate having a plurality of first cavities defined in the support plate including a stop member for selectively latching said plurality of locking tongues when the measuring device is selectively brought into aligned contact with the support plate.

11. The combination according to claim 10
    wherein the support plate includes electrical conductors.

12. A gauge device comprising:
    a housing;
    a plurality of spaced apart elastic locking members extending from the housing, the plurality of spaced apart locking members being adapted to engage a corresponding plurality of first cavities defined in an associated support plate to attach the gauge device with the associated support plate;
    a plurality of spaced apart contact pins extending from the housing, the plurality of contact pins being adapted for insertion into a corresponding plurality of contact cavities defined in the associated support plate, the plurality of spaced apart contact pins forming a gas-tight contact with the plurality of contact cavities when the gauge device is attached with the associated support plate; at least one centering member extending from the bottom surface of the housing, the at least one centering member being adapted for insertion into a corresponding at least one centering cavity defined in said associated support plate and extending from the bottom surface of the housing a greater distance than the plurality of contact pins extend from the bottom surface of the housing and extending from the bottom surface of the housing a greater distance than the plurality of elastic locking members extending from the bottom surface of the housing, the plurality of elastic locking members extend from the bottom surface of the housing a greater distance than the plurality of contact pins extend from the bottom surface of the housing.

13. The gauge device according to claim 12 wherein the plurality of spaced apart contact pins have a quadratic cross-section.

* * * * *